United States Patent
Pavlovic

[19]

[11] Patent Number: 6,154,367
[45] Date of Patent: Nov. 28, 2000

[54] HEAT SINK FOR PRINTED CIRCUIT BOARD

[75] Inventor: Slobodan Pavlovic, Canton, Mich.

[73] Assignee: Framatome Connectors Interlock, Inc., Westland, Mich.

[21] Appl. No.: 09/268,808

[22] Filed: Mar. 16, 1999

[51] Int. Cl.[7] ........................................... H05K 7/20
[52] U.S. Cl. ..................... 361/707; 174/252; 361/720
[58] Field of Search .................... 165/80.2, 80.3, 165/185; 174/16.3, 252, 254, 260; 361/704, 690, 707, 710, 715, 719–721, 749

[56] References Cited

U.S. PATENT DOCUMENTS

| | | | |
|---|---|---|---|
| 5,050,039 | 9/1991 | Edfors | 361/749 |
| 5,276,584 | 1/1994 | Collins et al. | 361/718 |
| 5,402,313 | 3/1995 | Casperson et al. | 361/710 |
| 5,812,375 | 9/1998 | Casperson | 361/707 |
| 5,831,828 | 11/1998 | Cutting et al. | 361/704 |

FOREIGN PATENT DOCUMENTS

| | | |
|---|---|---|
| 0340520 | 11/1989 | European Pat. Off. . |
| 0350588 | 2/1995 | European Pat. Off. . |

*Primary Examiner*—Gregory Thompson
*Attorney, Agent, or Firm*—Perman & Green, LLP

[57] ABSTRACT

An electronic component and heat sink assembly comprising at least one printed circuit board and a first heat transfer member sandwiched between portions of the at least one printed circuit board. The electronic components on the printed circuit board(s) are directly thermally connected to the heat transfer member on at least two different sides of the heat transfer member.

17 Claims, 1 Drawing Sheet

HEAT SINK FOR PRINTED CIRCUIT BOARD

BACKGROUND OF THE INVENTION

1. Field of the Invention

The present invention relates to heat dissipation and, more particularly, to an electronic component and heat sink assembly.

2. Prior Art

EP 0350588 discloses an electronic package with a heat sink. The heat sink is attached to a semiconductor device. The semiconductor device is connected to a rigid substrate by a flexible substrate. A problem exists in that high precision is needed for manufacturing old style heat dissipators used with components on a printed circuit board.

SUMMARY OF THE INVENTION

In accordance with one embodiment of the present invention an electronic component and heat sink assembly is provided comprising a printed circuit board and a first heat transfer member. The first heat transfer member is sandwiched between portion of the printed circuit board. Electronic components on the printed circuit board are directly thermally connected to the heat transfer member on at least two different sides of the heat transfer member.

In accordance with another embodiment of the present invention an electronic component and heat sink assembly is provided comprising a printed circuit board and a first heat transfer member. The printed circuit board comprises a flexible circuit member and electronic components extending from a first side of the flexible circuit member. The heat transfer member is mounted to the electronic components. The flexible circuit member is bent such that the electronic components are in thermal contact on at least two different sides of the heat transfer member.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT

Figure 1:
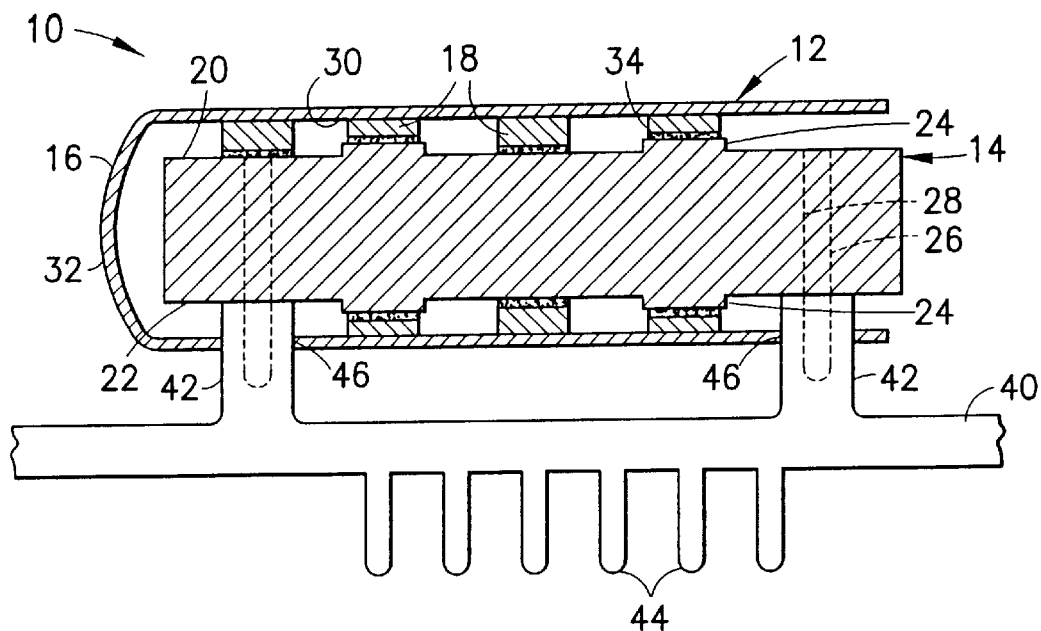
FIG. 1 is a partial cross-sectional view of an electronic component and heat sink assembly comprising features of the present invention.

Referring to FIG. 1, there is shown a partial cross-sectional view of an assembly 10 incorporating features of the present invention. Although the present invention will be described with reference to the embodiments shown in the drawings, it should be understood that the present invention can be embodied in many alternate forms of embodiments. In addition, any suitable size, shape of type of elements or materials could be used.

The assembly 10 generally comprises a printed circuit board 12 and a first heat transfer number 14. In this embodiment the printed circuit board 12 generally comprises a flexible circuit number 16 and electronic components 18. The flexible circuit member 16 comprises a flexible substrate and electrical lead lines on the substrate. In alternate embodiments the printed circuit board could have a rigid substrate. The electronic components 18 can comprise any suitable type of electronic component, such as semiconductor chips. The first heat transfer member 14 generally comprises an anodized aluminum plate. However, other types of materials and/or shapes could be provided. The plate 14 has two opposite sides 20, 22 which include raised mounting surfaces 24. The plate 14 also comprises holes 26 for fasteners 28.

The printed circuit board 12 is mounted to the plate 14 in order to remove heat from the electronic components 18. The electronic components 18 can generate heat during operation. Heat can decrease the working life of the printed circuit board 12. The assembly 10 could also be used in an environment which generates heat, such as in an engine compartment of an automobile. Thus, by providing the printed circuit board with the plate 14, heat can be removed from the electronic components 18 to increase the reliability and the working life of the printed circuit board 12; especially from heat peaks or spikes.

In this embodiment the electronic components 18 are mounted to a first side 30 of the flexible circuit member 16. Additional electronic components could also be mounted to the opposite side of flexible circuit member. The flexible circuit member 16 is bent at area 32 to form a general U-shape. Top sides of the electronic components 18 are mounted to the two sides 20, 22 of the plate 14 by suitable means, such as thermally conductive adhesive 34. Alternative or additional means could be used to mount the components 18 onto the plate 14. Not all the components 18 have the same height. Thus, the raised mounting surfaces 24 help to compensate for the height differences. Because the circuit member 16 is flexible, the heights of the raised surfaces 24 need not be precise. The circuit member 16 can flex to accommodate small height mismatches. Thus, the plate 14 does not need to be manufactured to overly exact specifications and can, therefore, be manufactured in an inexpensive and fast automated process. The attachment of the printed circuit board 12 to the plate 14 can, thus, also be accomplished in an inexpensive and fast process.

In this embodiment the assembly 10 further comprises a second heat transfer plate 40. The second heat transfer plate 40 is also comprised of a thermally conductive material, such as cast aluminum. In this embodiment the second plate 40 has mounting legs 42 and heat transfer cooling fins 44. The flexible circuit member 16 has holes 46. The legs 42 pass through the holes 46 and are attached to the first plate 14 by the fasteners 28. Thus, heat can transfer from the first plate 14, through the legs 42, to the fins 44 for removal to the surrounding air. In an alternate embodiment the first plate 14 could have mounting posts which pass through the holes 46 in the circuit member 16. In another alternate embodiment the second plate 40 need not be provided, such as when the first plate 14 has integral cooling fins. In another alternate embodiment the legs 42 could extend around the outside perimeter of the printed circuit board 12 such that the holes 46 need not be provided.

Figure 2:
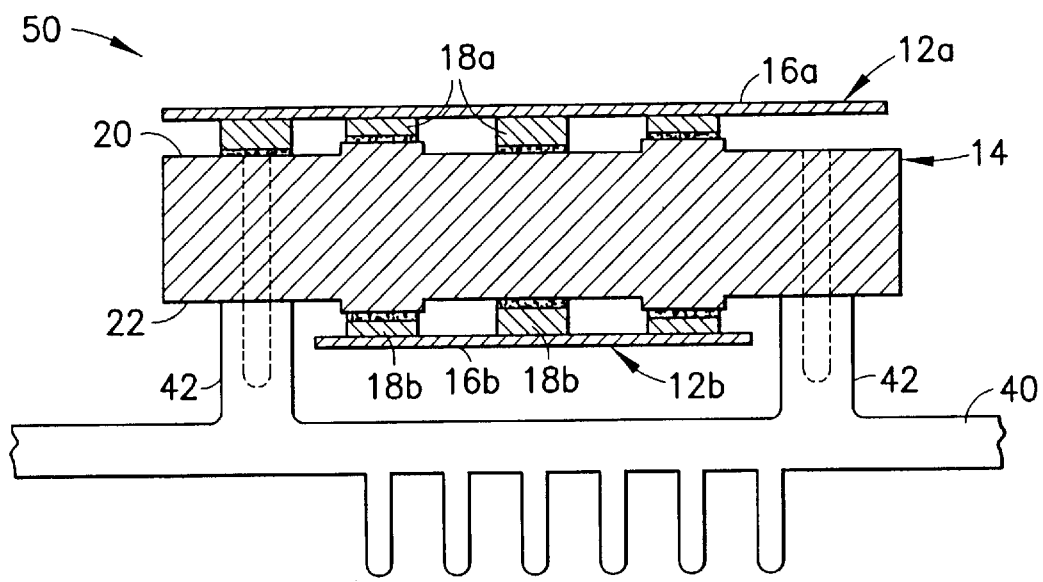
FIG. 2 is a partial cross-sectional view of an alternate embodiment of the present invention.

Referring now to FIG. 2, an alternate embodiment of the present invention is shown. In this embodiment the assembly 50 generally comprises the first plate 14, the second plate 40, and two printed circuit boards 12a and 12b. The two printed circuit boards 12a, 12b are mounted on the opposite sides 20, 22 of the first plate 14, respectively. In this embodiment the circuit members 16a, 16b of the boards 12a, 12b have flexible substrates, but they could have rigid substrates. The legs 42 pass by the side perimeter of the lower board 12b rather than through holes. The electronic components 18a, 18b are mounted on the respective sided 20, 22 for heat transfer.

The present invention allows a sub-assembly to be created in which a heat transfer element is sandwiched between a folded printed circuit board or two printed circuit boards. The heat transfer element could be attached to a radiator, such as fins 44. The radiator could be insert molded in a plastic box, such as disclosed in U.S. patent application Ser. No. 09/270,552, now U.S. Pat. No. 6,055,158 entitled "ELECTRONIC COMPONENT HEAT SINK ASSEMBLY" filed the same date as the present U.S. application, which is hereby incorporated by reference in its entirety. The use of a flexible circuit member reduces co-planarity problems between components 18 and the heat sink plate 14. In an alternate embodiment the printed circuit board(s) could be mounted to two sides of the first heat transfer member which are not opposite sides. The printed circuit board(s) could be mounted on more that two side of the first heat transfer member. The printed circuit board(s) could be mounted on only one side of the first heat transfer member. If the printed circuit board(s) is/are bent to be located on more than one side of the first heat transfer member, the board(s) could have any suitable shape including an L-shape. In addition, all of the electronic components 18 need not be mounted onto the surface of the first heat transfer member.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An electronic component and heat sink assembly comprising:
    at least one printed circuit board;
    a first heat transfer member sandwiched between the at least one printed circuit board; and
    a second heat transfer member connected to the first heat transfer member and having cooling fins,
    wherein electronic components on the at least one printed circuit board are directly thermally connected to the first heat transfer member on at least two different sides of the heat transfer member, and wherein the first and second heat transfer members are located, at least partially, on different sides of the at least one printed circuit board.

2. An assembly as in claim 1 wherein the at least one printed circuit board comprises a flexible circuit member.

3. An assembly as in claim 2 wherein the flexible circuit member is bent into a general U-shape.

4. An assembly as in claim 2 wherein the flexible circuit member has the electronic components on a first side thereof, and the electronic components on the first side of the flexible circuit member are mounted on the two different sides of the heat transfer member.

5. An assembly as in claim 4 wherein the two different sides of the heat transfer member comprise opposite sides of the heat transfer member.

6. An assembly as in claim 1 wherein the at least one printed circuit board comprises two printed circuit boards.

7. An assembly as in claim 6 wherein at least one of the two printed circuit boards comprises a flexible circuit member.

8. An assembly as in claim 1 wherein the first and second heat transfer members are located, at least partially, on different sides of the at least one printed circuit board, and at least one of the first and second heat transfer members comprising heat transfer elements connected to the other heat transfer member.

9. An assembly as in claim 1 wherein the second heat transfer member has portions which pass through the at least one printed circuit board.

10. An electronic component and heat sink assembly comprising:
    a printed circuit board comprising a flexible circuit member and electronic components extending from a first side of the flexible circuit member; and
    a first heat transfer member mounted to the electronic components, wherein the flexible circuit member is bent such that the electronic components are in thermal contact on at least two different sides of the heat transfer member, and
    a second heat transfer member, the first and second heat transfer members being located on different sides of the printed circuit board, and at least one of the first and second heat transfer members comprising heat transfer elements connected to the other heat transfer member.

11. An assembly as in claim 10 wherein the at least two different sides of the heat transfer member comprise two opposite sides of the heat transfer member.

12. An assembly as in claim 11 wherein the flexible circuit member has a general U-shape.

13. An assembly as in claim 10 wherein the electrical components are attached to the heat transfer member by thermally conductive adhesive.

14. An assembly as in claim 10 further comprising a second heat transfer member connected to the first heat transfer member, wherein the second heat transfer member comprises cooling fins.

15. An assembly as in claim 14 wherein the first and second heat transfer members are located, at least partially, on opposite sides of the printed circuit board.

16. An assembly as in claim 15 wherein portions of the second heat transfer member extend through holes in the flexible circuit member.

17. An electronic component and heat sink assembly comprising:
    a printed circuit board comprising a flexible circuit member and electronic components extending from a first side of the flexible circuit member; and
    a heat transfer member mounted to the electronic components, wherein the flexible circuit member is bent such that the electronic components are in thermal contact on at least two different sides of the heat transfer member, and wherein portions of the heat transfer member extend through holes in the flexible circuit member.

* * * * *